United States Patent
Sidhwa et al.

(10) Patent No.: US 6,265,312 B1
(45) Date of Patent: Jul. 24, 2001

(54) METHOD FOR DEPOSITING AN INTEGRATED CIRCUIT TUNGSTEN FILM STACK THAT INCLUDES A POST-NUCLEATION PUMP DOWN STEP

(75) Inventors: Ardeshir Jehangir Sidhwa, Scottsdale; Stephen John Melosky, Phoenix, both of AZ (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/366,071

(22) Filed: Aug. 2, 1999

(51) Int. Cl.[7] ............................................. H01L 21/44
(52) U.S. Cl. .................. 438/685; 438/680; 438/648; 427/250
(58) Field of Search ................... 438/597, 648, 438/685, 680; 427/250

(56) References Cited

U.S. PATENT DOCUMENTS

| | | | |
|---|---|---|---|
| 5,956,609 | * | 9/1999 | Lee et al. ............................. 438/627 |
| 6,066,366 | * | 9/1999 | Berenbaum et al. ................ 427/250 |

* cited by examiner

Primary Examiner—Caridad Everhart
(74) Attorney, Agent, or Firm—Theodore E. Galanthay; Lisa K. Jorgenson; Daniel E. Venglarik

(57) ABSTRACT

A tungsten film stack is formed on a wafer using a deposition chamber by first depositing a nucleation on the wafer in the presence of a carrier gas, such as nitrogen. Following deposition of the nucleation, excess carrier gas is evacuated from the deposition chamber. Then, following evacuation of the excess carrier gas, a tungsten fill is deposited over the nucleation.

20 Claims, 3 Drawing Sheets

METHOD FOR DEPOSITING AN INTEGRATED CIRCUIT TUNGSTEN FILM STACK THAT INCLUDES A POST-NUCLEATION PUMP DOWN STEP

BACKGROUND OF THE INVENTION

1. Technical Field

The present invention relates in general to the fabrication of integrated circuits and in particular to the deposition of metallizations in an integrated circuit. Still more particularly, the present invention relates to a method of depositing tungsten via fill stacks that provides an improved tungsten film stack profile across a wafer through the inclusion of a post-nucleation pump down step.

2. Description of the Related Art

Achieving performance enhancements in complementary metal-oxide-semiconductor (CMOS) technology requires both improved device performance and high circuit density. For current and future CMOS geometries, which obtain high circuit density in part by implementing multiple circuit layers, the formation of multi-level interconnects is an important stage of integrated circuit (IC) fabrication.

Tungsten (W) is widely utilized to interconnect various layers of metal in ICs. Tungsten metallizations are typically formed by chemical vapor deposition (CVD), which permits reliable filling of high aspect ratio contacts and vias and which yields interconnections that are resistant to electromigration. A conventional tungsten CVD process includes two principal steps: first, a nucleation step in which $WF_6$ is reduced by $SiH_4$ and $H_2$ at low pressure, and second, a deposition step in which a W (tungsten) fill is deposited at high pressure. It is well-known that nitrogen ($N_2$) is employed as the carrier gas for $SiH_4$ and can improve the reflectance (i.e., surface smoothness) of the deposited tungsten film by reducing the film grain size.

Referring now to FIG. 1, there is depicted a cross-sectional view of a portion of a wafer substrate including a conventionally formed tungsten plug. Wafer substrate 10 has a embedded metallization layer 12 that is electrically connected to features (e.g., transistor 8 ) in a lower layer by a tungsten plug 14 and can be electrically connected to features formed over two interlayer dielectric (ILD) layers 16 and 18 by a second tungsten plug 20. As shown, second tungsten plug 20 includes a number of layers, the first of which is a liner 22 comprising a 400 Å layer 24 of Ti and a 1000 Å layer 26 of TiN. After the liner deposition, the wafers are placed in the tungsten CVD tool. A tungsten fill stack is then deposited that includes a nucleation layer 27 of 800 Å, which is formed by reducing $WF_6$ with $SiH_4$ (at a 2:1 mixture) and $H_2$ under a low pressure of approximately 4.5 Torr. Following a brief stabilization period, a 7200 Å tungsten fill layer 28 is deposited under a high pressure of approximately 90 Torr to complete the tungsten fill stack.

If the tungsten deposition is successful, the profile of the tungsten plugs will vary across a wafer somewhat uniformly from thicker at the edges to thinner at the center. A wafer having this desirable tungsten plug profile is shown in plan view in FIG. 2A. As illustrated, wafer 40 is generally circular, with a notch 42 at one edge. The topography of the tungsten deposition on the surface of wafer 40 is indicated by concentric delineations 48 as varying substantially uniformly between thicker at edge region 44 and thinner at center region 46.

If on the other hand, film instability is experienced during the tungsten deposition, the tungsten plugs will have an undesirable profile in which the tungsten deposition is thicker at the center of the wafer and thinner at the edges of the wafer. A wafer having this undesirable tungsten deposition profile is shown in plan view in FIG. 2B. As illustrated, wafer 50 is generally circular, with a notch 52 at one edge. The topography of the tungsten deposition on the surface of wafer 50 is indicated by delineations 58 as varying non-uniformly between thinner at edge region 54 and thicker at center region 56.

Following the tungsten deposition, the wafer is typically subjected to either chemical etching or chemical-mechanical polishing (CMP) to remove excess tungsten. If the tungsten plugs have the desirable profile illustrated in FIG. 2A, then an etch back process would stop on liner 22, and a CMP process would stop on ILD 18, resulting in either case in a planar profile across the wafer from center to edge. If, however, the tungsten deposition results in the undesirable profile depicted in FIG. 2B, then a number of process problems can result from either an etch back or CMP process. In particular, tungsten that should be removed can remain adjacent to vias in the center of the wafer, while the wafer can be thinned towards the edges more than it should be. As a result, for an etch back process, fluorine ions remaining from the nucleation step can form $SF_6$ during the etch back process and attack liner 22. Consequently, $TiF_3$ may be formed, which is a well-known source of interconnect reliability problems. If, on the other hand, a CMP process is performed, ILD layer 18 will be thinner at the edge of the wafer than at the center, possibly resulting in dielectric breakdown, and recesses in the tungsten fill plugs may be created, possibly causing severe current leakage problems.

SUMMARY OF THE INVENTION

In order to avoid the process integration problems described above, it is important that a desirable tungsten film stack profile be obtained for each wafer that is processed. The present invention reliably achieves a desirable film stack profile for each wafer through an improved tungsten film stack deposition process that includes a post-nucleation pump down step.

According to the present invention, a tungsten film stack is formed on a wafer using a deposition chamber by first depositing a nucleation on the wafer in the presence of a carrier gas, such as nitrogen. Following deposition of the nucleation, excess carrier gas is evacuated from the deposition chamber. Then, following evacuation of the excess carrier gas, a tungsten fill is deposited over the nucleation.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 3A:
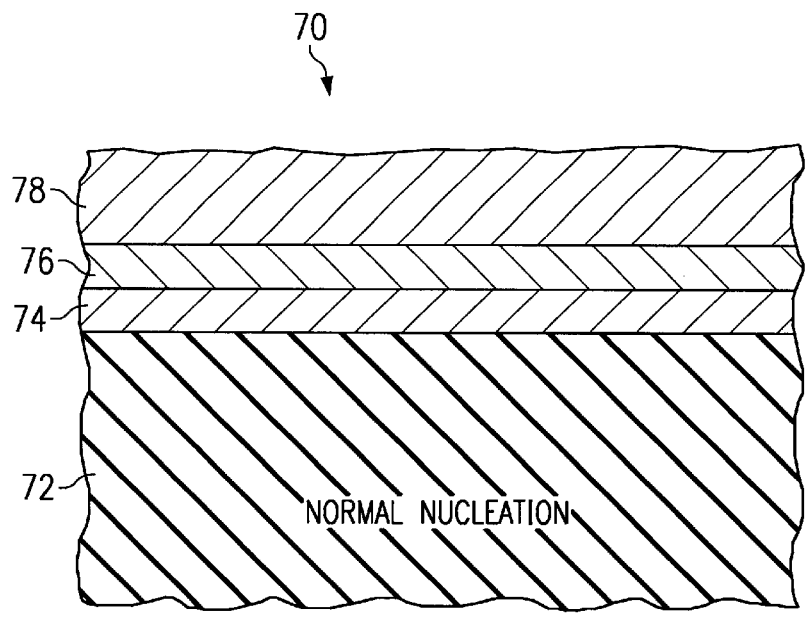
FIGS. 3A and 3B respectively illustrate scanning electron microscope images of the cross-section of a wafer having a desirable tungsten film stack profile and the cross-section of a wafer having an undesirable tungsten film stack profile.
Figure 3B:
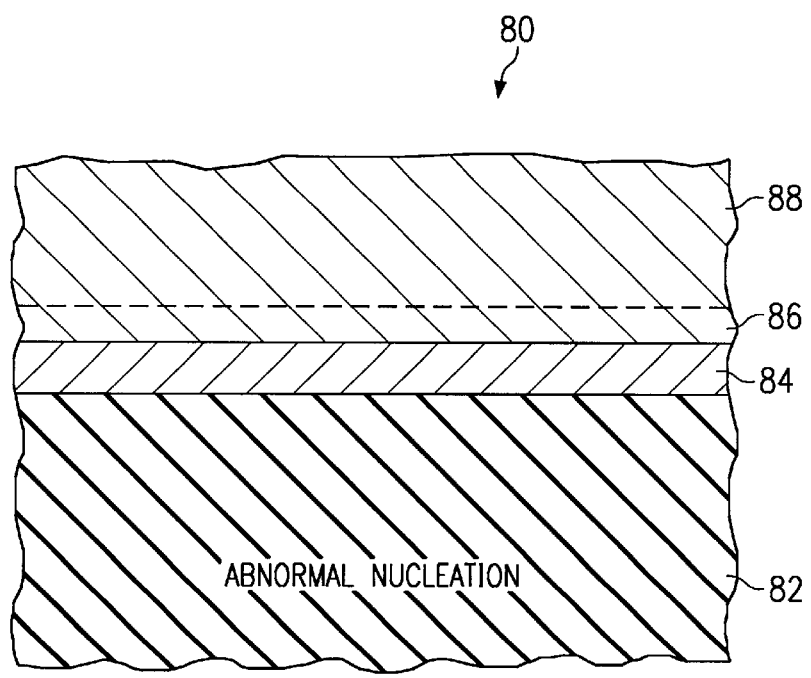

The conventional tungsten fill stack profiles that cause the process integration problems discussed above can be experimentally observed by obtaining scanning electron microscope (SEM) images of wafer cross-sections. Referring now to FIGS. 3A and 3B, cross-sectional SEM images of a wafer having a desirable tungsten film stack profile and of a wafer having an undesirable tungsten film stack profile are respectively depicted. The tungsten film stack depositions of wafer 70 of FIG. 3A and wafer 80 of FIG. 3B were both designed to have nucleation thicknesses of between 700 and 800 Å and tungsten fills of approximately 2000Å. The SEM data demonstrates that wafer 70 of FIG. 3A substantially satisfies the design parameters, namely, that over ILD 72 and TiN liner 74, a nucleation layer 76 of approximately 700–800 Å and a tungsten fill 78 of 2100 Å were deposited. The SEM data further reveal a difference in graining direction demarking the boundary between nucleation layer 76 and tungsten fill 78.

In contrast to FIG. 3A, FIG. 3B clearly shows that nucleation layer 86 of wafer 80, which is formed over ILD 82 and TiN liner 84, contains abnormal nucleation grains as compared to nucleation layer 76 of wafer 70. These nucleation grains continue into tungsten fill layer 88 with no change in orientation, making distinction between layers 86 and 88 difficult. FIG. 3B also illustrates that tungsten fill layer 88 has an abnormally large thickness (i.e., 2800 Å) as compared to tungsten fill layer 78 of wafer 70, which was fabricated by identical process steps.

Note: Tungsten fill thickness of 2100 Å target was used instead of 7200 Å for RBS (Rutherford Backscattering) analysis. RBS analysis goes by depth profile and our intrest was to study the stabalization step prior to w-Fill step. Although the shift in the pattern for 2100 Å showed same signatures as 7200 Å w-Fill thickness.

Figure 4:
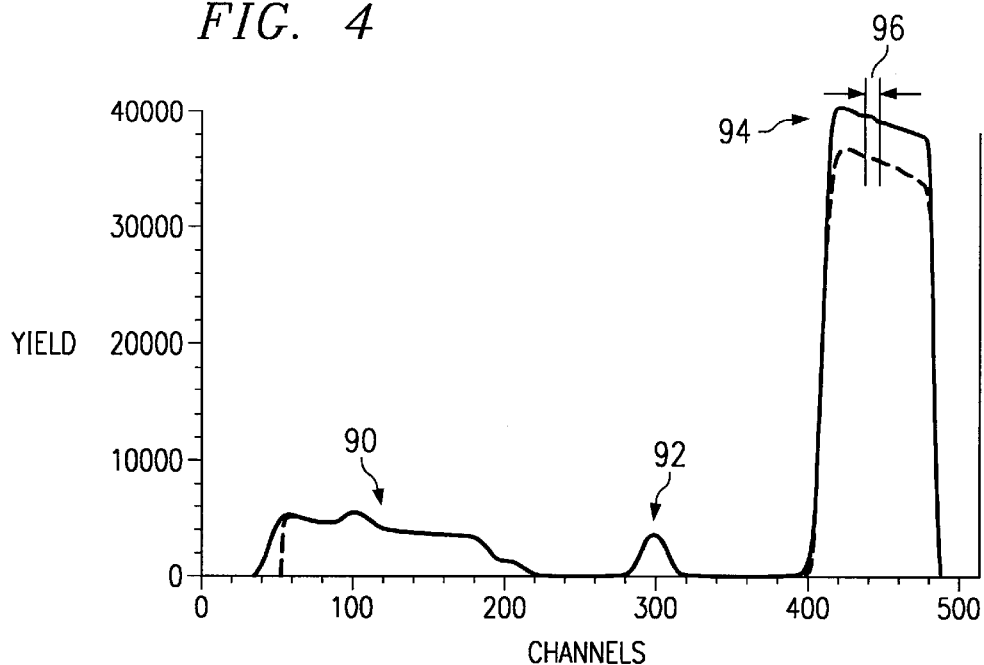
FIG. 4 is a plot of the results of channeled Rutherford Backscattering Spectroscopy (RBS) of the wafer illustrated FIG. 3B.

A Rutherford Backscattering Spectroscopy (RBS) analysis, such as that depicted in FIG. 4, can be utilized to perform a quantitative analysis of the composition, thickness, and depth profiles of wafer 80 of FIG. 3B, and can therefore be utilized to ascertain the point in the deposition process at which an abnormal condition arises. FIG. 4 illustrates both the theoretical (illustrated by a dashed-line curve) and experimentally measured (illustrated by a solid-line curve) yields of ions backscattered from wafer 80 versus channels. As indicated, the yield peak 90, which corresponds to Si atoms detected in $SiO_2$ ILD layer 82, and the yield peak 92, which corresponds to Ti atoms detected in TiN liner layer 84, both closely reflect theoretically predicted depth profiles. However, the yield peak shown at reference numeral 94, which corresponds to W atoms detected in the tungsten fill stack comprising layers 86 and 88, clearly reveals a difference in slope between the predicted and measured values at interval 96. That is, in interval 96, the theoretical curve experiences an increase in slope, while the experimental curve experiences a decrease in slope to zero (i.e., is flat). This slope differential indicates that an abnormal condition occurs following the nucleation deposition and prior to the tungsten fill.

The present invention recognizes that this abnormal condition arises from the presence of reaction byproducts of $WF_6$ and $SiH_4$ and excess $N_2$ during the stabilization period following nucleation and prior to the deposition of the tungsten fill. The presence of the reaction byproducts and $N_2$ can cause an interface change, which contributes to a shift the tungsten film stack profile and/or creates instability in the tungsten film stack. Of course, one option for reducing the process integration problems resulting from undesirable tungsten film stack profiles and film instability would be to eliminate use of $N_2$ during the deposition of the nucleation and during the stabilization period. However, as noted above, the use of $N_2$ advantageously improves surface reflectance by 11–15 %, which reduces wafer losses in subsequent photolithography patterning steps. In addition, the use of $N_2$ is helpful in reducing mixer block buildup in the tungsten CVD chambers. Thus, eliminating the use of $N_2$ as a carrier gas during nucleation and stabilization is an inadequate solution. The present invention therefore introduces a pump down step into the tungsten stack fill deposition process following nucleation in order to reduce nucleation reaction byproducts and excess $N_2$ in the CVD chamber prior to the tungsten fill step.

Figure 1:
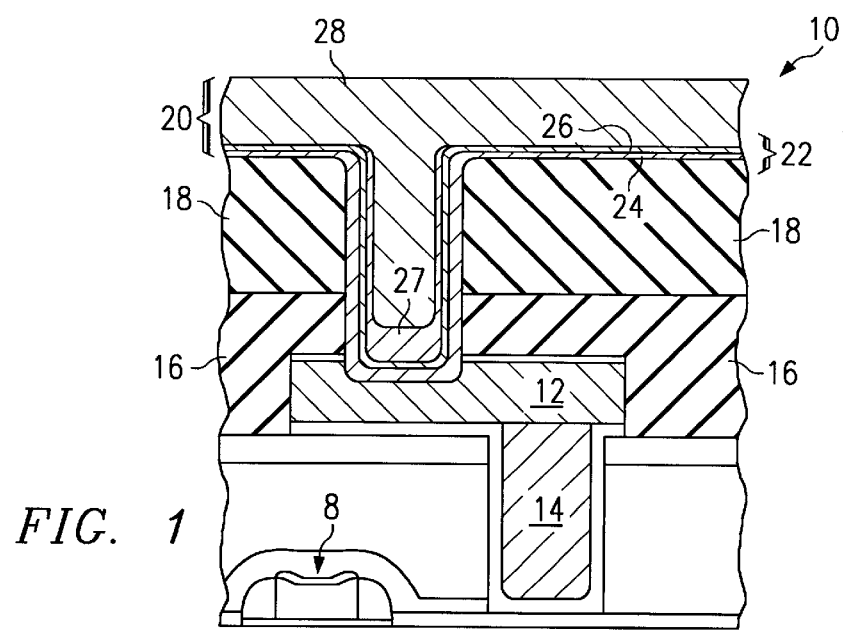
FIG. 1 is a cross-sectional view of a tungsten via fill stack in a wafer.
Figure 5:
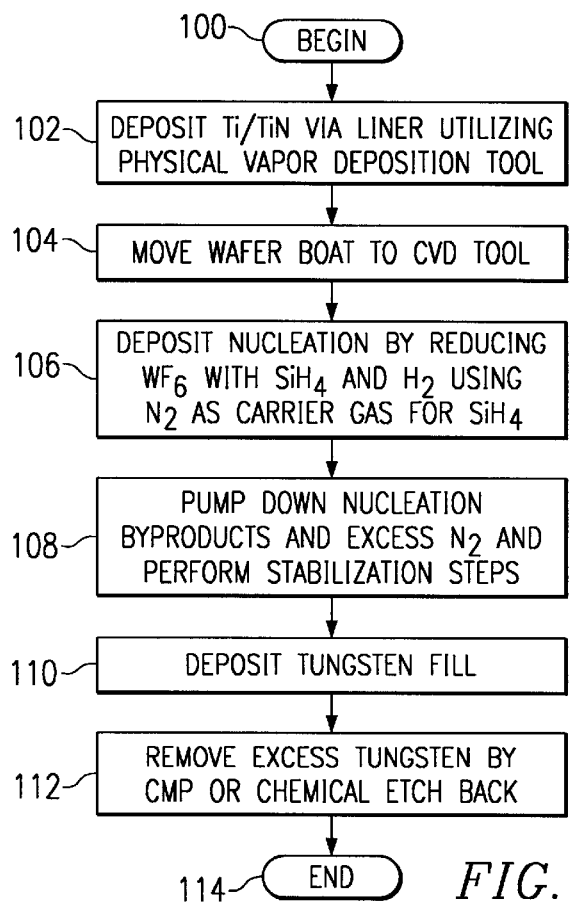
FIG. 5 is a high level logical flowchart of a process for chemical vapor deposition of a tungsten film stack in accordance with the present invention.

Referring now to FIG. 5, there is depicted a high level logical flowchart of an improved process for chemical vapor deposition of a tungsten film stack in accordance with the present invention. For clarity, the process will be described with reference to the deposition of second tungsten plug 20 on wafer 10 of FIG. 1.

As illustrated, the process begins at block 100 at which point a wafer 10 having one or more vias to be filled is placed in a Physical Vapor Deposition tool (e.g., in a boat holding a number of other wafers). Next, at block 102, a Ti/TiN liner 22 including, for example, a 400 Å layer 24 of Ti and a 1000 Å layer 26 of TiN, is deposited within the via and over the surface of ILD 18 using the Physical Vapor Deposition tool. Following the deposition of Ti/TiN liner 22, wafer 10 is transferred to the tungsten CVD tool, as shown at block 104.

The process then proceeds from block 104 to block 106, which illustrates beginning the chemical vapor deposition of a tungsten fill stack by depositing an 800 Å nucleation layer 26 by reducing $WF_6$ with $SiH_4$( 2:1) and $H_2$ under a low pressure of approximately 4.5 Torr. As is conventional, $N_2$ is utilized as a carrier gas for $SiH_4$ in order to improve reflectance and reduce mixer block buildup in the tungsten CVD tool. In order to avoid the reaction byproducts and excess $N_2$ that remain in the CVD chamber following nucleation causing a pattern shift or tungsten film instability during the stabilization period, a pump down step is performed, as depicted at block 108. During this step, which preferably has a duration of at least 4 seconds for typical tungsten CVD tools, gas flow in the tungsten CVD tool is shut off, and the pressure throttle is completely opened to evacuate the gaseous nucleation reaction byproducts and excess $N_2$. Thus, when stabilization steps, such as purging and pressurizing the tungsten CVD chamber for the tungsten fill deposition, are subsequently performed as also depicted at block 108, the abnormal conditions discussed above with reference to FIGS. 3B and 4 are avoided.

Figure 2A:
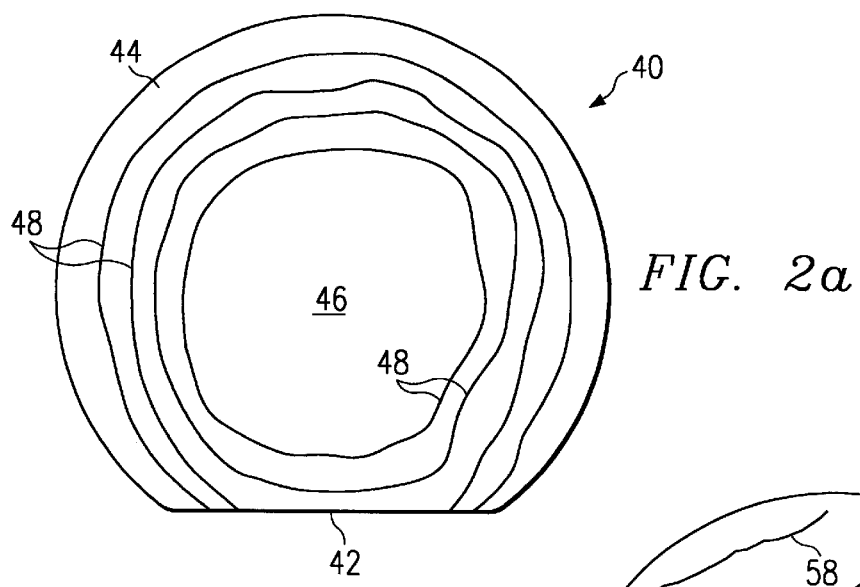
FIG. 2A is a top plan view of a desirable wafer topology.
Figure 2B:
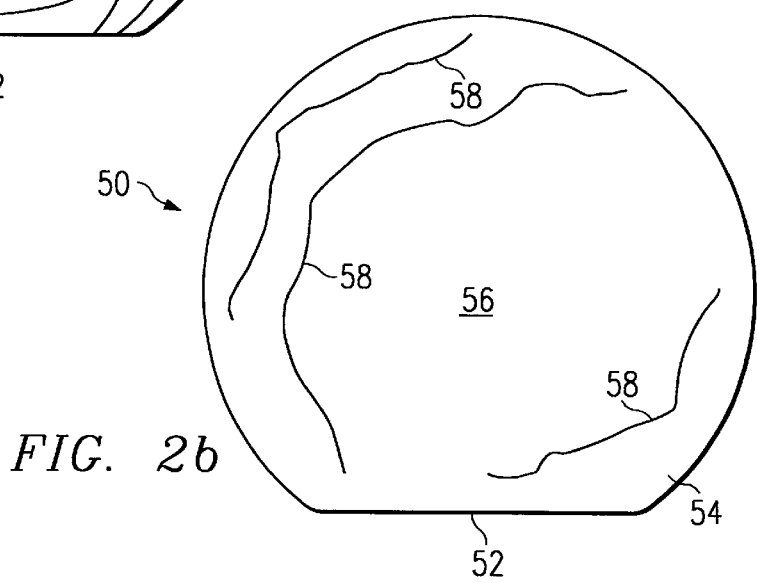
FIG. 2B is a top plan view of an undesirable wafer topology resulting from pattern shift or tungsten film stack instability.

Following block 108, the process proceeds to block 110, which depicts depositing a 7200 Å tungsten fill 28 under a high pressure of approximately 90 Torr. As a result, a wafer having the desirable tungsten fill stack profile illustrated in FIG. 2A is obtained. Thus, when the excess tungsten is subsequently removed, for example, by etch back with $SF_6$ or CMP as shown at block 112, a planar profile across wafer 10 will be obtained. Following block 114, the process continues at block 114.

It will be apparent to those skilled in the art that the high level process depicted in FIG. 5 can be implemented with any number of variations depending upon the desired deposition geometry, the CVD tool employed, and a number of other factors. One exemplary recipe for the above-described deposition of tungsten plug 20 in an Applied Materials CENTURA tungsten CVD tool is summarized in tabular format in Tables I–VIII. The 24 steps in the recipe can generally be grouped as follows:

(1) steps 1–7: process initialization;
(2) step 8: pre-nucleation;
(3) steps 9–12: nucleation deposition;
(4) step 13: pump down;
(5) steps 14–16: stabilization;
(6) steps 17–20: tungsten fill deposition; and
(7) steps 21–24: process completion.

TABLE I

| Step number & name | 1 Position Wafer | 2 Gas On | 3 Pressurize |
| --- | --- | --- | --- |
| Chamber selection | ABCD-all clr | ABCD-all clr | ABCD-all clr |
| Step end control | by time | by time | by time |
| Maximum step time | 7.0 seconds | 1.0 second | 5.0 seconds |
| Endpoint selection | no endpoint | no endpoint | no endpoint. |
| Pressure | throttle fully open | throttle fully open | servo 30.0 Torr |
| RF power and match | 0 W auto | 0 W auto | 0 W auto |
| Heater temperature | 475φ (wafer = 427φ) | 475φ (wafer = 427φ) | 475 φ (wafer = 429φ) |
| Temperature ramp | 0.00 φ/second | 0.00 φ/second | 0.00 φ/second |
| Heater spacing | 400 mils | 400 mils | 400 mils |
| Temp. preset | 0 mW | 0 mW | 0 mW |
| Bottom purge | off | on | on |
| Vacuum chuck | bypass | bypass | bypass |
| Microwave Gen. Power | 0 W | 0 W | 0 W |
| Gas names and flows | : : | Ar: 300 scc $N_2$: 295 scc | Ar: 2000 scc $N_2$: 295 scc |

TABLE II

| Step number & name | 4 Heat | 5 Chuck | 6 Check |
| --- | --- | --- | --- |
| Chamber Selection | ABCD-all clr | ABCD-all clr | ABCD-all clr |
| Step end control | by time | by time | by time |
| Maximum step time | 20.0 seconds | 5.0 seconds | 5.0 seconds |
| Endpoint selection | no endpoint | no endpoint | no endpoint |
| Pressure | servo 30.00 Torr | servo 30.00 Torr | servo 30.0 torr |
| RF power and match | 0 W auto | 0 W auto | 0 W auto |
| Heater temperature | 475φ (wafer = 429φ) | 475φ (wafer = 429φ) | 475φ (wafer = 429φ) |
| Temperature ramp | 0.00 φ/second | 0.00 φ/second | 0.00 φ/second |
| Heater spacing | 400 mils | 400 mils | 400 mils |
| Temp. preset | 0 mW | 0 mW | 0 mW |
| Bottom purge | on | on | on |
| Vacuum chuck | off | full press 0.0 | full press 3.0 |
| Microwave Gen. Power | 0 W | 0 W | 0 W |
| Gas names and flows | Ar: 2000 scc $N_2$: 295 scc | Ar: 1000 scc $N_2$: 295 scc | Ar: 1000 scc $N_2$: 295 scc |

TABLE II-continued

| Step number & name | 4 Heat | 5 Chuck | 6 Check |
|---|---|---|---|
| | : | $H_2$: 1000 scc | $H_2$: 1000 scc |
| | : | : | : |
| | $SiH_4$: 30 scc | $SiH_4$: 30 scc | $SiH_4$: 30 scc |

TABLE III

| Step number & name | 7 Depressurize | 8 Pre-Nucleation | 9 Nuc A |
|---|---|---|---|
| Chamber Selection | ABCD-all clr | ABCD-all clr | A-all clr |
| Step end control | by time | by time | by time |
| Maximum step time | 6.0 seconds | 5.0 seconds | 33.0 seconds |
| Endpoint selection | no endpoint | no endpoint | no endpoint |
| Pressure | throttle to 350 | servo 4.5 Torr | servo 4.5 Torr |
| RF power and match | 0 W auto | 0 W auto | 0 W auto |
| Heater temperature | 475φ | 475φ | 475φ |
| | (wafer = 427φ) | (wafer = 403φ) | (wafer = 403φ) |
| Temperature ramp | 0.00 φ/second | 0.00 φ/second | 0.00 φ/second |
| Heater spacing | 400 mils | 400 mils | 400 mils |
| Temp. preset | 0 mW | 0 mW | 0 mW |
| Bottom purge | on | on | on |
| Vacuum chuck | preset press 3.0 | preset press 3.0 | preset press 3.0 |
| Microwave Gen. Power | 0 W | 0 W | 0 W |
| Gas names and flows | Ar: 2300 scc | Ar: 1000 scc | Ar: 1000 scc |
| | $N_2$: 295 scc | $N_2$: 295 scc | $N_2$: 295 scc |
| | $H_2$: 700 scc | $H_2$: 700 scc | $H_2$: 700 scc |
| | : | : | $WF_6$-Io: 20 scc |
| | $SiH_4$: 30 scc | $SiH_4$: 30 scc | $SiH_4$: 10 scc |
| | : | : | : |
| | : | Ar-edge: 200 scc | Ar-edge: 200 scc |

TABLE IV

| Step number & name | 10 Nuc B | 11 Nuc C | 12 Nuc D |
|---|---|---|---|
| Chamber Selection | B-all clr | C-all clr | D-all clr |
| Step end control | by time | by time | by time |
| Maximum step time | 33.0 seconds | 33.0 seconds | 33.0 seconds |
| Endpoint selection | no endpoint | no endpoint | no endpoint |
| Pressure | servo 4.5 Torr | servo 4.5 Torr | servo 4.5 Torr |
| RF power and match | 0 W auto | 0 W auto | 0 W auto |
| Heater temperature | 475φ | 475φ | 475φ |
| | (wafer = 403φ) | (wafer = 403φ) | (wafer = 403φ) |
| Temperature ramp | 0.00 φ/sec | 0.00 φ/sec | 0.00 φ/sec |
| Heater spacing | 400 mils | 400 mils | 400 mils |
| Temp. preset | 0 mW | 0 mW | 0 mW |
| Bottom purge. | on | on | on |
| Vacuum chuck | preset press 3.0 | preset press 3.0 | preset press 3.0 |
| Microwave Gen. Power | 0 W | 0 W | 0 W |
| Gas names and flows | Ar: 1000 scc | Ar: 1000 scc | Ar: 1000 scc |
| | $N_2$: 295 scc | $N_2$: 295 scc | $N_2$: 295 scc |
| | $H_2$: 700 scc | $H_2$: 700 scc | $H_2$: 700 scc |
| | $WF_6$-Io: 20 scc | $WF_6$-Io: 20 scc | $WF_6$-Io: 20 scc |
| | $SiH_4$: 10 scc | $SiH_4$: 10 scc | $SiH_4$: 10 scc |
| | : | : | : |
| | Ar-edge: 200 scc | Ar-edge: 200 scc | Ar-edge: 200 scc |

TABLE V

| Step number & name | 13 Pump | 14 Purge | 15 Pressure |
|---|---|---|---|
| Chamber Selection | ABCD-all clr | ABCD-all clr | ABCD-all clr |
| Step end control | by time | by time | by time |
| Maximum step time | 10.0 seconds | 5.0 seconds | 12.0 seconds |
| Endpoint selection | no endpoint | no endpoint | no endpoint |
| Pressure | throttle fully open | servo 4.5 torr | servo 4.5 torr |
| RF power and match | 0 W auto | 0 W auto | 0 W auto |
| Heater temperature | 475φ (wafer = 427φ) | 475φ (wafer = 403φ) | 475φ (wafer = 435φ) |
| Temperature ramp | 0.00 φ/second | 0.00 φ/second | 0.00 φ/second |
| Heater spacing | 400 mils | 400 mils | 400 mils |
| Temp. preset | 0 mW | 0 mW | 0 mW |
| Bottom purge | on | on | on |
| Vacuum chuck | full press 0.0 | full press 3.0 | preset press 3.0 |
| Microwave Gen. Power | 0 W | 0 W | 0 W |
| Gas names and flows | : | Ar: 2300 scc | Ar: 2300 scc |
|  | : | $N_2$: 295 scc | $N_2$: 295 scc |
|  | : | $H_2$: 700 scc | $H_2$: 700 scc |
|  | : | : | : |
|  | : | : | : |
|  | : | : | : |
|  | : | Ar-edge: 200 scc | Ar-edge: 200 scc |

TABLE VI

| Step number & name | 16 Backside | 17 Dep A | 18 Dep B |
|---|---|---|---|
| Chamber Selection | ABCD-all clr | A-all clr | B-all clr |
| Step end control | by time | by time | by time |
| Maximum step time | 2.0 seconds | 64.0 seconds | 71.0 seconds |
| Endpoint selection | no endpoint | no endpoint | no endpoint |
| Pressure | servo 90.0 Torr | servo 90.0 Torr | servo 90.0 Torr |
| RF power and match | 0 W auto | 0 W auto | 0 W auto |
| Heater temperature | 475φ (wafer = 435φ) | 475φ (wafer = 435φ) | 475φ (wafer = 435φ) |
| Temperature ramp | 0.00 φ/second | 0.00 φ/second | 0.00 φ/second |
| Heater spacing | 400 mils | 400 mils | 400 mils |
| Temp. preset | 0 mW | 0 mW | 0 mW |
| Bottom purge | on | on | on |
| Vacuum chuck | preset press 25.0 | preset press 28.0 | preset press 23.0 |
| Microwave Gen. Power | 0 W | 0 W | 0 W |
| Gas names and flows | Ar: 1000 scc | Ar: 1000 scc | Ar: 1000 scc |
|  | $N_2$: 295 scc | $N_2$: 295 scc | $N_2$: 295 scc |
|  | $H_2$: 700 scc | $H_2$: 700 scc | $H_2$: 700 scc |
|  | : | $WH_6$-hi: 95 scc | $WH_6$-hi: 95 scc |
|  | : | : | : |
|  | : | : | : |
|  | Ar-edge: 1800 scc | Ar-edge: 1800 scc | Ar-edge: 1800 scc |
|  | $H_2$-edge: 420 scc | $H_2$-edge: 375 scc | $H_2$-edge: 400 scc |

TABLE VII

| Step number & name | 19 Dep C | 20 Dep D | 21 Purge |
|---|---|---|---|
| Chamber Selection | C-all clr | D-all clr | ABCD-all clr |
| Step end control | by time | by time | by time |
| Maximum step time | 63.0 seconds | 67.0 seconds | 5.0 seconds |
| Endpoint selection | no endpoint | no endpoint | no endpoint |
| Pressure | servo 90.0 Torr | servo 90.0 Torr | servo 90.0 Torr |
| RF power and match | 0 W auto | 0 W auto | 0 W auto |
| Heater temperature | 475φ (wafer = 435φ) | 475φ (wafer = 435φ) | 475φ (wafer = 435φ) |
| Temperature ramp | 0.00 φ/second | 0.00 φ/second | 0.90 φ/second |
| Heater spacing | 400 mils | 400 mils | 400 mils |
| Temp. preset | 0 mW | 0 mW | 0 mW |
| Bottom purge | on | on | on |
| Vacuum chuck | preset press 28.0 | preset press 25.0 | full press 0.0 |
| Microwave Gen. Power | 0 W | 0 W | 0 W |
| Gas names and flows | Ar: 1000 scc | Ar: 1000 scc | Ar: 2300 scc |
|  | $N_2$: 295 scc | $N_2$: 295 scc | $N_2$: 295 scc |

TABLE VII-continued

| Step number & name | 19 Dep C | 20 Dep D | 21 Purge |
|---|---|---|---|
| | $H_2$: 700 scc | $H_2$: 700 scc | $H_2$: 700 scc |
| | $WF_6$-hi: 95 scc | $WH_6$-hi: 95 scc | |
| | : | : | : |
| | : | : | : |
| | Ar-edge: 1800 scc | Ar-edge: 1800 scc | Ar-edge: 1800 scc |
| | $H_2$-edge: 375 scc | $H_2$-edge: 405 scc | $H_2$-edge: 270 scc |

TABLE VIII

| Step number & name | 22 Equalize | 23 Lift Wafer | 24 Purge |
|---|---|---|---|
| Chamber Selection | ABCD-all clr | ABCD-all clr | ABCD-all clr |
| Step end control | by time | by time | by time |
| Maximum step time | 2.0 seconds | 7.0 seconds | 5.0 seconds |
| Endpoint selection | no endpoint | no endpoint | no endpoint |
| Pressure | servo 90.0 Torr | servo 90.0 Torr | throttle fully open |
| RF power and match | 0 W auto | 0 W auto | 0 W auto |
| Heater temperature | 475φ | 475φ | 475φ |
| | (wafer = 435φ) | (wafer = 435φ) | (wafer = 427φ) |
| Temperature ramp | 0.00 φ/second | 0.00 φ/second | 0.00 φ/second |
| Heater spacing | 400 mils | 1500 mils | 1500 mils |
| Temp. preset | 0 mW | 0 mW | 0 mW |
| Bottom purge | on | on | on |
| Vacuum chuck | bypass | off | off |
| Microwave Gen. Power | 0 W | 0 W | 0 W |
| Gas names and flows | Ar: 2300 scc | Ar: 2300 scc | Ar: 2300 scc |
| | $N_2$: 295 scc | $N_2$: 295 scc | $N_2$: 295 scc |
| | $H_2$: 700 scc | $H_2$: 700 scc | $H_2$: 700 scc |
| | : | : | : |
| | : | : | : |
| | : | : | : |
| | Ar-edge: 500 scc | : | : |

As has been described, the present invention provides an improved method for depositing a tungsten fill plug on an integrated circuit wafer by employing a post-nucleation pump down step. A deposition process in accordance with the present invention permits the use of $N_2$ during nucleation to achieve enhanced reflectance, while preventing an undesirable shift in the tungsten deposition profile. A deposition process in accordance with the present invention also does not suffer appreciable lengthening of the deposition process since the pump down step is extremely brief, and experimental depositions reflect no negative impact on the parametric and EWS yield data.

While the invention has been particularly shown and described with reference to an illustrative embodiment, it will be understood by those skilled in the art that various changes in form and detail may be made therein without departing from the spirit and scope of the invention.

What is claimed is:

1. A method for depositing a tungsten film stack on a wafer using a deposition chamber, comprising:
   depositing a nucleation layer on a wafer while a nitrogen carrier gas is present within the deposition chamber;
   following deposition of the nucleation layer, at least partially evacuating the deposition chamber; and
   following the at least partial evacuation of the deposition chamber, depositing a tungsten fill over the nucleation layer.

2. The method of claim 1, wherein the step of depositing a nucleation layer on a wafer while a nitrogen carrier gas is present within the deposition chamber further comprises:
   depositing the nucleation layer on the wafer while nitrogen gas is flowed into the deposition chamber.

3. The method of claim 1, wherein the steps of depositing a nucleation layer on a wafer while a nitrogen carrier gas is present within the deposition chamber and depositing a tungsten fill over the nucleation layer further comprise:
   depositing the nucleation layer within a via formed in the wafer; and
   depositing the tungsten fill within the via and over the nucleation layer.

4. The method of claim 3, further comprising:
   prior to deposition of the nucleation layer, depositing a liner within the via.

5. The method of claim 1, wherein the step of at least partially evacuating the deposition chamber further comprises:
   shutting off gas flow into the deposition chamber; and
   performing a pump down for at least four seconds.

6. The method of claim 1, further comprising:
   following the at least partial evacuation of the deposition chamber and prior to deposition of the tungsten fill, performing one or more stabilization steps within the deposition chamber.

7. The method of claim 1, wherein the step of at least partially evacuating the deposition chamber further comprises:
   fully evacuating the deposition chamber.

8. The method of claim 1, wherein the step of at least partially evacuating the deposition chamber further comprises:

evacuating the nitrogen carrier gas, any reactant gases, and any reaction byproducts from the deposition chamber.

9. The method of claim 1, wherein the step of at least partially evacuating the deposition chamber further comprises:
    shutting off gas flow into the deposition chamber; and
    performing a pump down within the deposition chamber.

10. The method of claim 9, wherein the step of performing a pump down within the deposition chamber further comprises:
    performing the pump down for between four and ten seconds.

11. The method of claim 1, further comprising:
    following the at least partial evacuation of the deposition chamber and prior to deposition of the tungsten fill, purging and pressurizing the deposition chamber.

12. The method of claim 11, wherein the step of purging and pressurizing the deposition chamber further comprises:
    purging and pressurizing the deposition chamber with gases including nitrogen.

13. A method for depositing a tungsten film stack using a deposition chamber, comprising:
    within a via formed in a wafer, depositing a liner;
    depositing a nucleation layer in the via and over the liner in the presence of a nitrogen carrier gas and reactant gases;
    following deposition of the nucleation layer within the via, evacuating the nitrogen carrier and reactant gases from the deposition chamber; and
    following evacuation of the nitrogen carrier and reactant gases from the deposition chamber, depositing a tungsten fill within the via over the nucleation layer.

14. The method of claim 13, wherein the step of depositing a nucleation layer in the via and over the liner in the presence of a nitrogen carrier gas and reactant gases further comprises:
    depositing the nucleation layer by reacting $WF_6$, $SiH_4$ and $H_2$ reactant gases.

15. The method of claim 13, further comprising:
    after evacuating the nitrogen carrier and reactant gases from the deposition chamber, purging and pressurizing the deposition chamber.

16. The method of claim 15, wherein the step of purging and pressurizing the deposition chamber further comprises:
    purging and pressurizing the deposition chamber with gases including nitrogen.

17. The method of claim 13, wherein the step of evacuating the nitrogen carrier and reactant gases from the deposition chamber further comprises:
    shutting off gas flow into the deposition chamber; and
    performing a pump down for at least four seconds.

18. The method of claim 13, further comprising:
    following evacuation of the nitrogen carrier and reactant gases from the deposition chamber and prior to deposition of the tungsten fill within the via over the nucleation layer, performing one or more stabilization steps within the deposition chamber.

19. The method of claim 13, wherein the step of evacuating the nitrogen carrier and reactant gases from the deposition chamber further comprises:
    shutting off gas flow into the deposition chamber; and
    performing a pump down within the deposition chamber.

20. The method of claim 19, wherein the step of performing a pump down within the deposition chamber further comprises:
    performing the pump down for between four and ten seconds.

* * * * *